United States Patent
Kondo et al.

(10) Patent No.: US 7,619,465 B2
(45) Date of Patent: Nov. 17, 2009

(54) FILTER CIRCUIT AND SEMICONDUCTOR DEVICE

(75) Inventors: Hideaki Kondo, Yokohama (JP); Masaru Sawada, Yokohama (JP); Norio Murakami, Yokohama (JP); Syoichi Masui, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/125,609

(22) Filed: May 22, 2008

(65) Prior Publication Data
US 2008/0297240 A1   Dec. 4, 2008

(30) Foreign Application Priority Data
May 31, 2007   (JP)   ............... 2007-145061

(51) Int. Cl.
*H03K 5/00* (2006.01)
(52) U.S. Cl. ...................... 327/553; 327/558
(58) Field of Classification Search .......... 327/551–559
See application file for complete search history.

(56) References Cited

U.S. PATENT DOCUMENTS

| 7,382,181 B2 * | 6/2008 | Chowdhury et al. ......... 327/553 |
| 7,474,160 B2 * | 1/2009 | Erdogan et al. ............... 331/59 |

FOREIGN PATENT DOCUMENTS

| JP | 2001-274654 A | 10/2001 |
| JP | 2002-100962 A | 4/2002 |
| JP | 2006-287900 A | 10/2006 |

OTHER PUBLICATIONS

P. Quinlan et al.; "A Multimode 0.3-200-kb/s Transceiver for the 433/868/915-MHz Bands in 0.25- μm CMOS", IEEE Journal of Solid-State Circuits, vol. 39, No. 12, p. 2297-2310.

* cited by examiner

*Primary Examiner*—Dinh T. Le
(74) *Attorney, Agent, or Firm*—Arent Fox LLP (57) ABSTRACT

A filter circuit includes a low-pass filter and a calibration circuit calibrating a frequency characteristic of the low-pass filter. The calibration circuit includes a negative feedback circuit and a control circuit.

6 Claims, 7 Drawing Sheets

FILTER CIRCUIT AND SEMICONDUCTOR DEVICE

CROSS-REFERENCE TO RELATED APPLICATION

This application is based upon and claims the benefit of priority from Japanese Patent Application No. 2007-145061, filed on May 31, 2007, the entire contents of which are incorporated herein by reference.

BACKGROUND

1. Field

The present embodiment relates to a filter circuit and a semiconductor device including a filter circuit which may include a calibration function of a filter circuit.

2. Description of the Related Art

In a communication semiconductor device, a demodulated signal greatly deviates from an ideal signal since characteristics of a filter in an IF circuit which processes a received signal vary due to manufacturing processes, and this worsens a bit error rate and thus necessitates the calibration of the characteristics of the filter.

As a conventional art to calibrate characteristics of a filter, there has been known a method in which an oscillation circuit is formed by using a replica circuit of the filter, characteristics of the replica circuit are controlled so that the oscillation circuit has a constant oscillation frequency, and the characteristics of the filter are controlled similarly to the characteristics of the replica circuit (first conventional art: see, for example, Japanese Unexamined Patent Application Publication No. 2002-100962, and P. Quinlan et al., "A Multimode 0.3-200-kb/s Transceiver for the 433/868/915-MHz Bands in 0.25-µm CMOS", IEEE J. Solid-State Circuits, vol. 39, no. 12, December 2004). As another conventional art, there has been known a method in which characteristics of a filter are controlled so that a delay time of a circuit including the filter becomes constant (second conventional art: see, for example, Japanese Unexamined Patent Application Publication No. 2006-287900). As still another conventional art, there has been known a method in which a band-pass filter functions as a closed-loop oscillation circuit and characteristics of the band-pass filter are controlled so that the oscillation circuit has a constant oscillation frequency (third conventional art: see, for example, Japanese Unexamined Patent Application Publication No. 2001-274654).

In the first conventional art, due to the need for providing the replica circuit, chip size and power consumption of a semiconductor device having the filter mounted thereon increases. Further, since the characteristics of the filter are controlled based on information which is indirectly obtained by using the replica circuit, calibration accuracy is lower than when the characteristics of the filter are controlled based on information directly obtained from the filter.

In the second conventional art, delay time measurement is used, but when a digital circuit is operated by the same clock frequency, the use of the delay time measurement results in lowered calibration accuracy since it is more difficult to highly accurately execute the delay time measurement than to execute the frequency measurement. There is another problem that this art is not directly applicable to a complex band-pass filter.

In the third conventional art, a center frequency and a Q-value of the band-pass filter, which determine the frequency characteristics of the band-pass filter, have to be separately calibrated since a gain and the Q-value of the band-pass filter need to have a proportional relation. Further, an amplitude detection circuit has to be provided to calibrate the Q-value of the band-pass filter, which increases circuit scale of the band-pass filter.

SUMMARY

It is an aspect of the embodiments discussed herein to provide a filter circuit mounted on a semiconductor device includes a low-pass filter and a calibration circuit calibrating a frequency characteristic of the low-pass filter. The calibration circuit may include a negative feedback circuit and a control circuit.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE EMBODIMENTS

Hereinafter, embodiments will be described with reference to the drawings.

Figure 1:
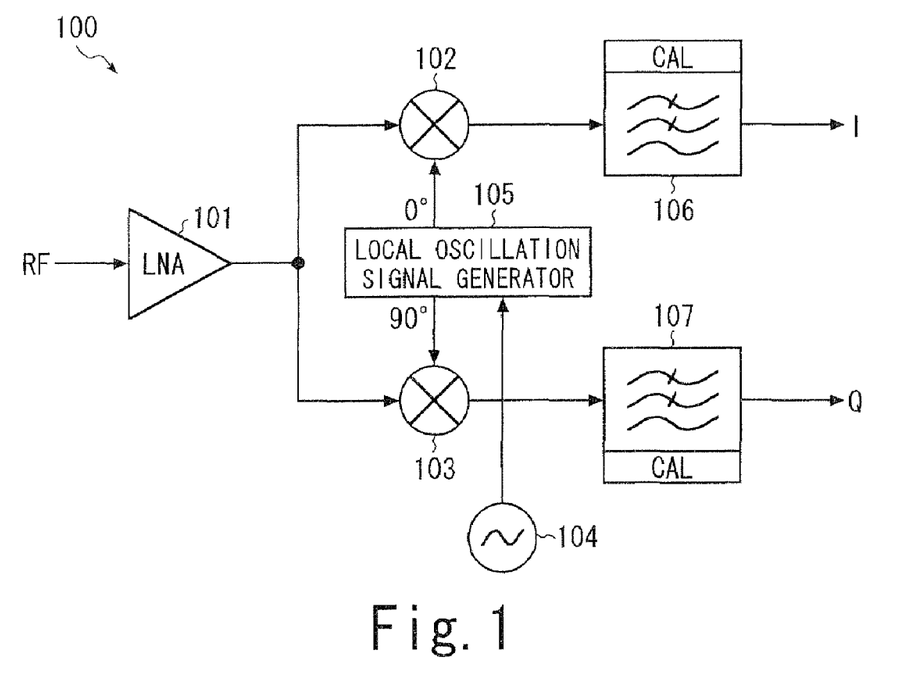
FIG. 1 is an explanatory diagram illustrating a first embodiment.

FIG. 1 illustrates a first embodiment. A communication semiconductor device 100 of the first embodiment includes a low noise amplifier (LNA) 101 provided in a radio receiver circuit, mixers 102, 103, an oscillator 104, a local oscillation signal generator 105, and low-pass filters 106, 107. The mixer 102 mixes a high frequency signal supplied via the low noise amplifier 101 and one of local oscillation signals supplied from the local oscillation signal generator 105 to output the resultant to the low-pass filter 106. The mixer 103 mixes the high frequency signal supplied via the low noise amplifier 101 and the other of the local oscillation signals supplied from the local oscillation signal generator 105 to output the resultant to the low-pass filter 107. The local oscillation signal generator 105 generates the pair of local oscillation signals with a 90° phase difference, based on an oscillation signal supplied from the oscillator 104. The low-pass filter 106 filters out unnecessary frequency components in the output signal of the mixer 102 to output the resultant. The low-pass filter 107 filters out unnecessary frequency components in the output signal of the mixer 103 to output the resultant. Further, the low-pass filters 106, 107 have a calibration function (CAL) for calibrating frequency characteristics.

Figure 2:
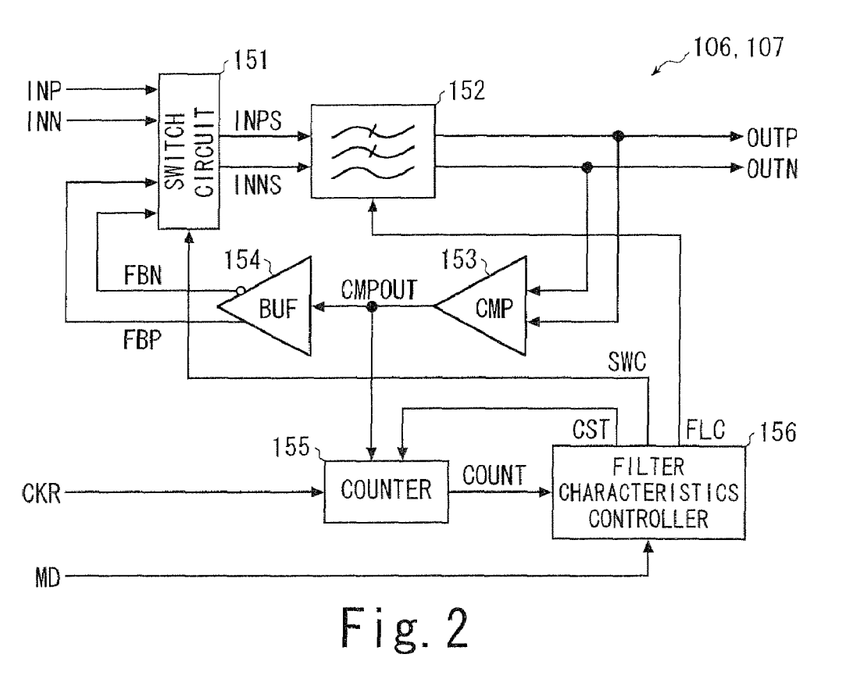
FIG. 2 is an explanatory diagram illustrating details of low-pass filters in FIG. 1.

FIG. 2 illustrates details of the low-pass filters in FIG. 1. Each of the low-pass filters 106, 107 includes a switch circuit 151, a filter 152, a comparator (CMP) 153, a buffer (BUF) 154, a counter 155, and a filter characteristics controllers 56. When a switch control signal SWC supplied from the filter characteristics controller 156 is set low, the switch circuit 151 selects input signals INP, INN to output them as filter input signals INPS, INNS to the filter 152. On the other hand, when the switch control signal SWC is set high, the switch circuit 151 selects feedback signals FBP, FBN supplied from the buffer 154 to output them as the filter input signals INPS, INNS to the filter 152.

The filter 152 filters out unnecessary frequency components in the filter input signals INPS, INNS supplied from the switch circuit 151 to output the resultant as filter output signals OUPT, OUTN. Frequency characteristics of the filter 152 are variably set according to a filter characteristics control signal FLC supplied from the filter characteristics controller 156. Further, the filter 152 is configured so that its Q-value is determined by an element-value ratio (ratio of element values) of internal elements (resistor elements and capacitor elements). The comparator 153 compares voltages of the filter output signals OUTP, OUTN supplied from the filter 152 and inverts a digital output signal CMPOUT in response to a change of a magnitude relation between the filter output signals OUTP, OUTN. The buffer 154 generates the feedback signals FBP, FBN from the digital output signal CMPOUT of the comparator 153 to output them to the switch circuit 151.

When the switch control signal SWC is set high, the switch circuit 151, the filter 152, the comparator 153, and the buffer 154 form a loop circuit. The comparator 153 and the buffer 154 are coupled so as to give a negative feedback to the filter 152, an output part of the buffer 154 is configured so as to make a gain of the loop circuit larger than one, and the loop circuit oscillates with a frequency so that the filter input signals INPS, INNS and the filter output signals OUTP, OUTN have a 180° phase difference. The loop circuit oscillates independently of the Q-value of the filter 152. The oscillation frequency of the loop circuit is determined by the frequency characteristics of the filter 152, and therefore, by adjusting the frequency characteristics of the filter 152 so that the oscillation frequency of the loop circuit becomes constant (so that the oscillation frequency of the loop circuit falls within a predetermined range), it is possible to calibrate the frequency characteristics of the filter 152. For example, the filter 152 is a fourth-order Butterworth low-pass filter, and the oscillation frequency of the loop circuit is equal to a cut-off frequency of the filter 152.

In response to a rising transition (transition from low to high) of a counter control signal CST supplied from the filter characteristics controller 156, the counter 155 performs a count operation synchronizing with a reference clock signal CKR during a predetermined period which is set based on a period of the digital output signal CMPOUT of the comparator 153 (an oscillation period of the loop circuit). Upon completion of the count operation, the counter 155 outputs a count value COUNT to the filter characteristics controller 156. Further, the counter 155 initializes the count value COUNT to zero in response to a falling transition (transition from high to low) of the counter control signal CST.

The filter characteristics controller 156 sets the switch control signal SWC high when a mode signal MD is set high, and sets the switch control signal SWC low when the mode signal MD is set low. The mode signal MD is set low when the low-pass filters 106, 107 are in a normal mode, and is set high when the low-pass filters 106, 107 are in a calibration mode. Further, when the mode signal MD is set high, the filter characteristics controller 156 controls the counter 155 by way of the counter control signal CST so that the counter 155 performs the count operation, thereby obtaining the count value COUNT, and adjusts the frequency characteristics of the filter 152 by way of a filter characteristics control signal FLC so that the count value COUNT falls within a range from a first reference value COUNT1 to a second reference value COUNT2 (COUNT2>COUNT1). By setting an execution period of the count operation of the counter 155 in a plurality of periods of the digital output signal CMPOUT of the comparator 153, it is possible to improve resolution of the oscillation frequency of the loop circuit.

Figure 3:
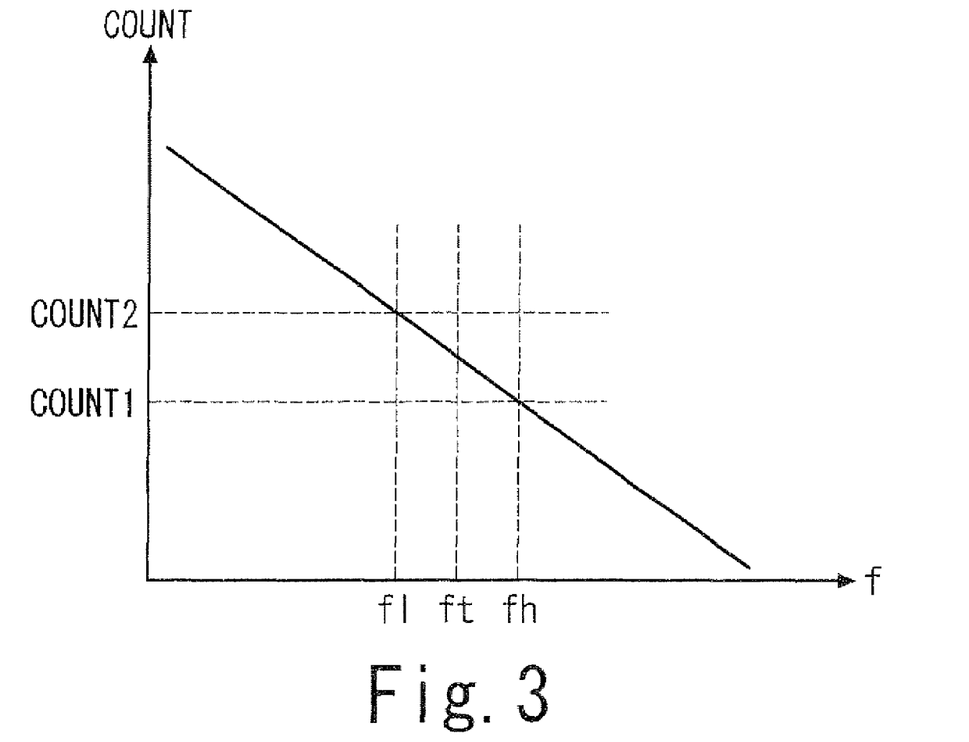
FIG. 3 is an explanatory chart illustrating the correlation between a count value of a counter and an oscillation frequency of a loop circuit in FIG. 2.

FIG. 3 illustrates the correlation between the count value of the counter and the oscillation frequency of the loop circuit in FIG. 2. In FIG. 3, the count value COUNT of the counter 155 is taken on the vertical axis and the oscillation frequency f of the loop circuit is taken on the horizontal axis. As illustrated in FIG. 3, the higher the oscillation frequency f of the loop circuit becomes, the smaller the count value COUNT of the counter 155 becomes. For example, in the low-pass filters 106, 107, the frequency characteristics of the filter 152 are adjusted so that the oscillation frequency f of the loop circuit falls within a range from a lower limit value fl to an upper limit value fh with a target value ft being a center therebetween. Therefore, the first reference value COUNT1 used by the filter characteristics controller 156 corresponds to the count value COUNT that the counter 155 outputs when the oscillation frequency f of the loop circuit has the upper limit value fh. The second reference value COUNT2 used by the filter characteristics controller 156 corresponds to the count value COUNT that the counter 155 outputs when the oscillation frequency f of the loop circuit has the lower limit value fl.

Figure 4:
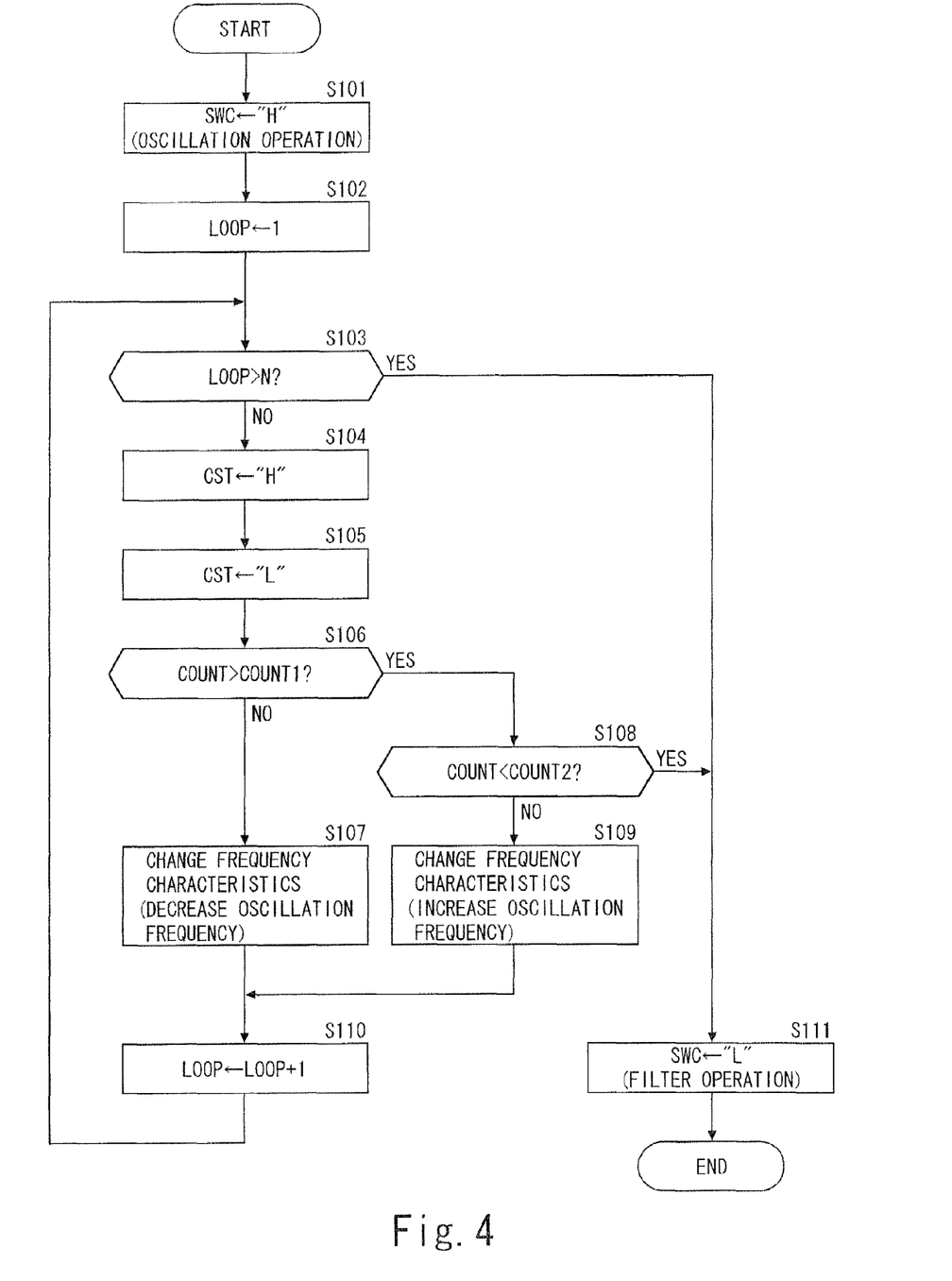
FIG. 4 is an explanatory chart illustrating a calibration sequence of the low-pass filter in FIG. 2.

FIG. 4 illustrates a calibration sequence of the low-pass filter in FIG. 2.

At step S101, the filter characteristics controller 156 changes the switch control signal SWC from low to high in response to the transition of the mode signal MD from low to high. Accordingly, the switch circuit 151 selects the feedback signals FBP, FBN to output them as the filter input signals INPS, INNS. As a result, the switch circuit 151, the filter 152, the comparator 153, and the buffer 154 form the loop circuit, and the loop circuit performs an oscillation operation. Thereafter, the calibration sequence shifts to step S102.

At step S102, the filter characteristics controller 156 initializes the number of loop times LOOP to 1. Thereafter, the calibration sequence shifts to step S103.

At step S103, the filter characteristics controller 156 determines whether or not the number of loop times LOOP is larger than a predetermined value N. When the number of loop times LOOP is equal to or smaller than the predetermined value N, the calibration sequence shifts to step S104. On the other hand, when the number of loop times LOOP is larger than the predetermined value N, the calibration sequence shifts to step S111.

At step S104, the filter characteristics controller 156 changes the counter control signal CST from low to high. Accordingly, the counter 155 performs the count operation synchronizing with the reference clock signal CKR during a predetermined period which is set based on the period of the digital output signal CMPOUT of the comparator 153. Then, the filter characteristics controller 156 obtains the count value COUNT upon completion of the count operation of the counter 155. Thereafter, the calibration sequence shifts to step S105.

At step S105, the filter characteristics controller 156 changes the counter control signal CST from high to low. Accordingly, the counter 155 initializes the counter value COUNT to zero. Thereafter, the calibration sequence shifts to step S106.

At step S106, the filter characteristics controller 156 determines whether or not the count value COUNT obtained at step S104 is larger than the first reference value COUNT1. When the count value COUNT is equal to or smaller than the first reference value COUNT1, the calibration sequence shifts to step S107. On the other hand, when the count value COUNT is larger than the first reference value COUNT1, the calibration sequence shifts to step S108.

At step S107, the filter characteristics controller 156 changes the frequency characteristics of the filter 152 by way of the filter characteristics control signal FLC so that the oscillation frequency of the loop circuit decreases. Thereafter, the calibration sequence shifts to step S110.

At step S108, the filter characteristics controller 156 determines whether or not the count value COUNT obtained at step S104 is smaller than the second reference value COUNT2. When the count value COUNT is equal to or larger than the second reference value COUNT2, the calibration sequence shifts to step S109. On the other hand, when the count value COUNT is smaller than the second reference value COUNT2, the calibration sequence shifts to step S111.

At step S109, the filter characteristics controller 156 changes the frequency characteristics of the filter 152 by way of the filter characteristics control signal FLC so that the oscillation frequency of the loop circuit increases. Thereafter, the calibration sequence shifts to step S110.

At step S110, the filter characteristics controller 156 increments the number of loop times LOOP. Thereafter, the calibration sequence shifts to step S103.

At step S11, the filter characteristics controller 156 changes the switch control signal SWC from high to low in response to the change of the mode signal MD from high to low. Accordingly, the switch circuit 151 selects the input signals INP, INN to output them as the filter input signals INPS, INNS. As a result, the filter 152 performs the filter operation. Here, the calibration sequence is completed.

In the first embodiment as described above, since the frequency characteristics of the filter 152 are calibrated without using a replica circuit, a circuit having the calibration function can be small in circuit scale and low in power consumption, which can reduce chip size and power consumption of the semiconductor device 100. Further, since the method using the frequency measurement is adopted, it is possible to calibrate the frequency characteristics of the filter 152 more accurately than when a method using delay time measurement is adopted. In this manner, in the first embodiment, the frequency characteristics of the low-pass filters 106, 107 (filter 152) can be calibrated easily and accurately. Moreover, since the loop circuit oscillates independently of the Q-value of the filter 152, the Q-value of the filter 152 can be set arbitrarily and a cut-off frequency of the filter 152 and a gain can be independently set. Further, the Q-value of the filter 152 is determined by the element-value ratio of the internal elements, which can eliminate a need for the calibration of the Q-value of the filter 152.

Figure 5:
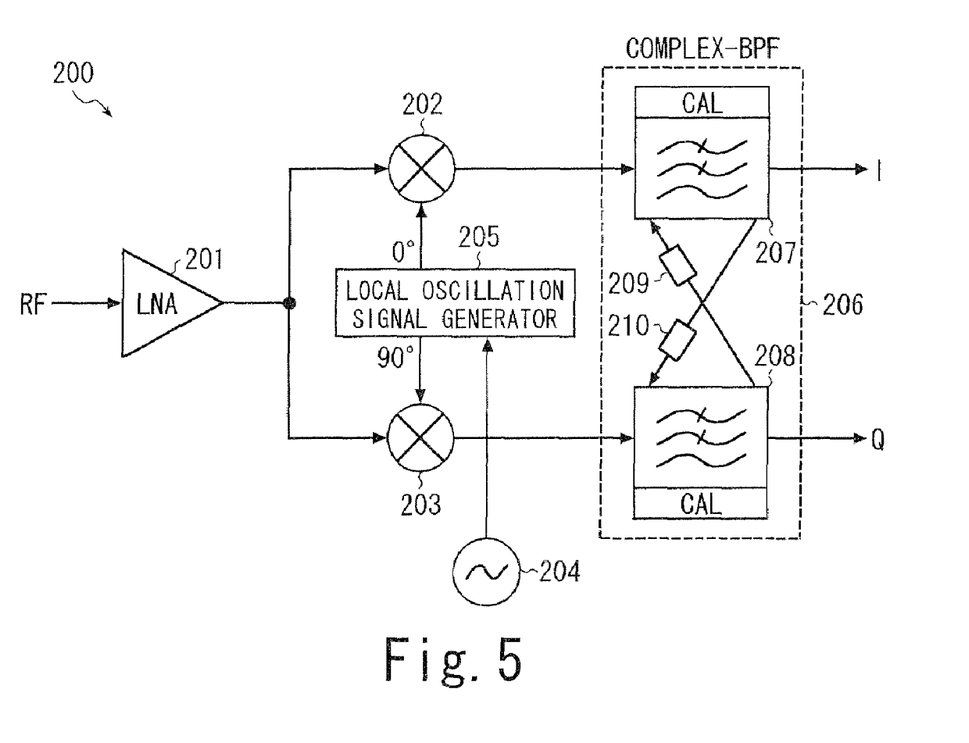
FIG. 5 is an explanatory diagram illustrating a second embodiment.

FIG. 5 illustrates a second embodiment. A communication semiconductor device 200 of the second embodiment includes a low noise amplifier (LNA) 201 provided in a radio receiver circuit, mixers 202, 203, an oscillator 204, a local oscillation signal generator 205, and a complex band-pass filter (COMPLEX-BPF) 206. The low noise amplifier 201, the mixers 202, 203, the oscillator 204, and the local oscillation signal generator 205 are the same circuits as the low noise amplifier 101, the mixers 102, 103, the oscillator 104, and the local oscillation signal generator 105 in the first embodiment (FIG. 1).

The complex band-pass filter 206 is a filter capable of image removal by utilizing a phase difference between an I-side and a Q-side, and includes low pass filters 207, 208 and I-side/Q-side feedback circuits 209, 210. The low-pass filters 207, 208 have the same internal configuration as that of the low-pass filters 106, 107 in the first embodiment (FIG. 2). The I-side/Q-side feedback circuits 209, 210 are configured so that a center frequency of the complex band-pass filter 206 is proportional to a cut-off frequency of the low-pass filters 207, 208. Further, the I-side/Q-side feedback circuits 209, 210 invalidate I-side/Q-side feedback signals when a mode signal MD (not shown) is set high. That is, the complex band-pass filter 206 performs a complex band-pass filter operation when the mode signal MD is set low, and performs a low-pass filter operation when the mode signal MD is set high. Frequency characteristics (a center frequency and a band width) of the complex band-pass filter 206 and frequency characteristics (a cut-off frequency) of the low-pass filters 207, 208 are determined by an element-value ratio of internal elements.

Figure 6:
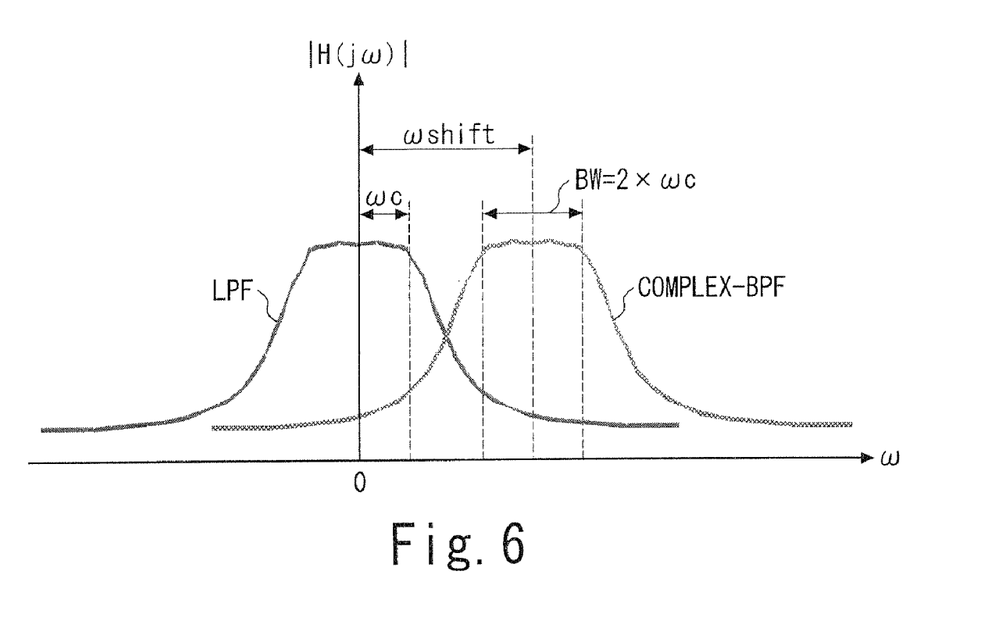
FIG. 6 is an explanatory chart illustrating a frequency characteristic of a complex band-pass filter in FIG. 5.

FIG. 6 illustrates the frequency characteristics of the complex band-pass filter in FIG. 5. In FIG. 6, a frequency $\omega$ is taken on the horizontal axis and a transfer function $|H(j\omega)|$ is taken on the vertical axis. A frequency characteristics curve of the complex band-pass filter (COMPLEX-BPF) 206 is a frequency characteristics curve of the low-pass filters (LPF) 207, 208 shifted in the frequency axis direction, and is expressed by a center frequency $\omega$shift and a band width BW. The band width BW of the complex band-pass filter 206 is twice as large as a cut-off frequency $\omega$c of the low-pass filters 207, 208.

A frequency ratio of the center frequency $\omega$shift of the complex band-pass filter 206 and the cut-off frequency $\omega$c of the low-pass filters 207, 208 is determined by an element-value ratio of the internal elements and thus is little influenced by manufacturing variation. Therefore, in the complex band-pass filter 206 in which the ratio of the center frequency $\omega$shift and the band width BW is determined by the element-value ratio of the internal elements, in accordance with the calibration of the cut-off frequency $\omega$c of the low-pass filters 207, 208, the center frequency $\omega$shift and the band width BW of the complex band-pass filter 206 are also automatically calibrated.

Figure 7:
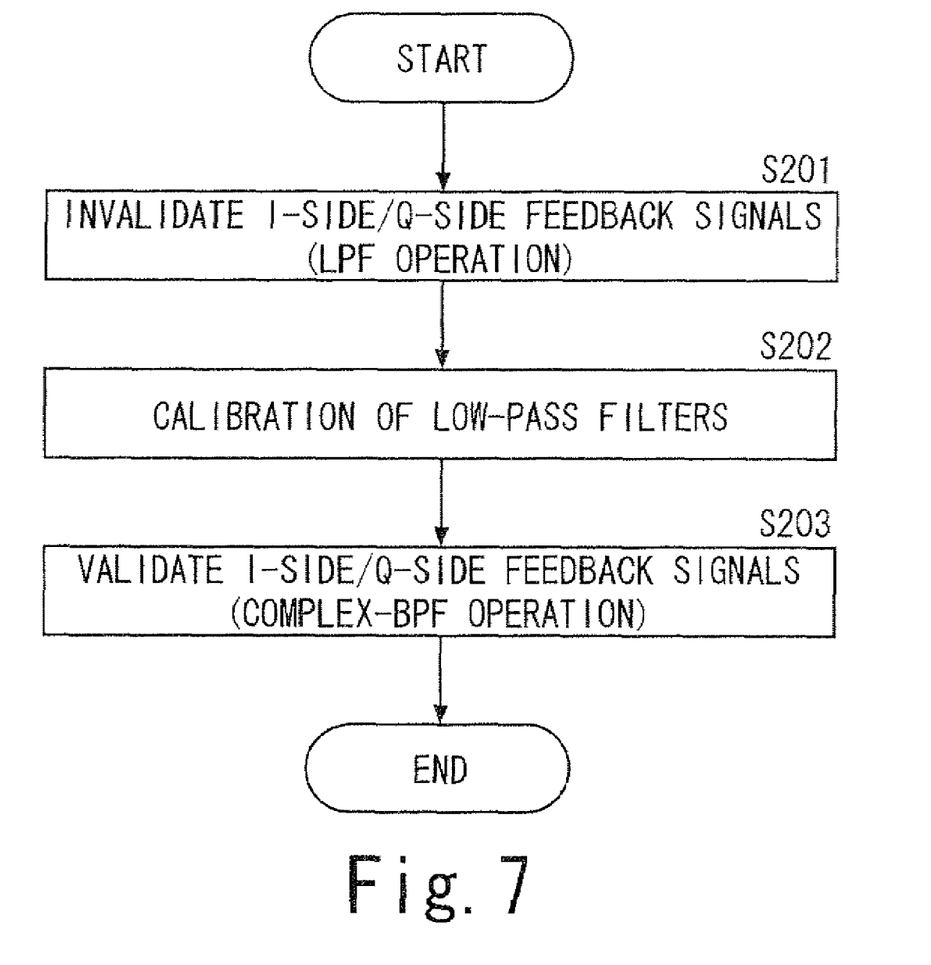
FIG. 7 is an explanatory chart illustrating a calibration sequence of the complex band-pass filter in FIG. 5.

FIG. 7 illustrates a calibration sequence of the complex band-pass filter in FIG. 5.

At step S201, the I-side/Q-side feedback circuits 209, 210 invalidate the I-side/Q-side feedback signals in response to the transition of the mode signal MD from low to high. Accordingly, the complex band-pass filter 206 performs the low-pass filter operation (LPF operation). Thereafter, the calibration sequence shifts to step S202.

At step S202, the calibration sequence of the low-pass filters 207, 208 is performed similarly to the calibration sequence of the low-pass filters 106, 107 in the first embodiment (FIG. 4). Thereafter, the calibration sequence shifts to step S203.

At step S203, the I-side/Q-side feedback circuits 209, 210 validate the I-side/Q-side feedback signals in response to the transition of the mode signal MD from high to low. Accordingly, the complex band-pass filter 206 performs the complex band-pass filter operation (COMPLEX-BPF operation). Here, the calibration sequence is completed.

In the second embodiment as described above, as in the calibration sequence of the low-pass filters 106, 107 in the first embodiment, in accordance with the calibration of the frequency characteristics (the cut-off frequency) of the low-pass filters 207, 208, the frequency characteristics (the center frequency and the band width) of the complex band-pass filter

206 are also automatically calibrated. Therefore, it is possible to calibrate the frequency characteristics of the complex band-pass filter 206 easily and accurately.

The first and second embodiments describe the examples where the present embodiment is applied to the calibration of the frequency characteristics of the IF filter in the communication semiconductor device, but it should be noted that the present embodiment may be applied to the calibration of frequency characteristics of a low-pass filter in a semiconductor device other than the communication semiconductor device.

It is a proposition of the aforementioned embodiment to provide an art for realizing simple and accurate calibration of frequency characteristics of a filter.

According to an aspect of the embodiment, a filter circuit mounted on a semiconductor device includes a low-pass filter and a calibration circuit calibrating a frequency characteristic of the low-pass filter. The calibration circuit includes a negative feedback circuit and a control circuit. When the filter circuit is in a calibration mode, the negative feedback circuit gives a negative feedback to the low-pass filter to form a loop circuit and sets a gain of the loop circuit larger than one to make the loop circuit oscillate. When the filter circuit is in the calibration mode, the control circuit controls the frequency characteristic of the low-pass filter so as to make an oscillation frequency of the loop circuit fall within a predetermined range.

For example, the negative feedback circuit includes a comparator, a buffer, and a switch circuit. The comparator generates a digital output signal from an output signal of the low-pass filter. The buffer generates a feedback signal from the digital output signal of the comparator. The switch circuit selects an input signal to output the input signal as an input signal of the low-pass filter when the filter circuit is in a normal mode, and selects the feedback signal to output the feedback signal as the input signal of the low-pass filter when the filter circuit is in the calibration mode. The control circuit includes a counter and an adjustment circuit. When the filter circuit is in the calibration mode, the counter performs a count operation during a predetermined period which is set based on a period of the digital output signal of the comparator. When the filter circuit is in the calibration mode, the adjustment circuit compares a count value of the counter and a reference value to adjust the frequency characteristic of the low-pass filter according to a result of the comparison. Further, the loop circuit oscillates independently of a Q-value of the low-pass filter. A Q-value of the low-pass filter is determined by an element-value ratio of internal elements. For example, the low-pass filter is a fourth-order Butterworth low-pass filter and an oscillation frequency of the loop circuit is equal to a cut-off frequency of the low-pass filter.

In the above-described aspect of the embodiment, since the frequency characteristic of the low-pass filter is calibrated without using a replica circuit, the calibration circuit can be small in scale and low in power consumption, which can reduce chip size and power consumption of the semiconductor device. Further, adopting the method using the frequency measurement enables more accurate calibration of the frequency characteristic of the low-pass filter than adopting a method using delay time measurement. In this manner, according to the aspect of the embodiment, it is possible to calibrate the frequency characteristic of the low-pass filter easily and accurately. Further, since the loop circuit oscillates independently of the Q-value of the low-pass filter, the Q-value of the low-pass filter can be arbitrarily set, which makes it possible to set the cut-off frequency and a gain of the low-pass filter separately. Further, the Q-value of the low-pass filter depends on the element-value ratio of the internal elements, which can eliminate a need for the calibration of the Q-value of the low-pass filter.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A filter circuit comprising:
   a low-pass filter; and
   a calibration circuit calibrating a frequency characteristic of the low-pass filter, wherein
   the calibration circuit includes:
      a feedback circuit which forms an oscillation circuit with the low-pass filter when the filter circuit is in a calibration mode, the oscillation circuit being formed by a negative feedback loop having a gain larger than one; and
      a control circuit which controls the frequency characteristic of the low-pass filter so as to make an oscillation frequency of the oscillation circuit falls within a predetermined range, when the filter circuit is in the calibration mode, in which
   the feedback circuit comprises:
      a comparator generating a digital output signal from an output signal of the low-pass filter;
      a buffer generating a feedback signal from the digital output signal of the comparator; and
      a switch circuit which selects an input signal to output the input signal as an input signal of the low-pass filter when the filter circuit is in a normal mode, and selects the feedback signal to output the feedback signal as the input signal of the low-pass filter when the filter circuit is in the calibration mode, and
   the control circuit comprises:
      a counter which performs a count operation during a predetermined period which is set based on a period of the digital output signal of the comparator, when the filter circuit is in the calibration mode; and
      an adjustment circuit which compares a count value of the counter and a reference value to adjust the frequency characteristic of the low-pass filter according to a result of the comparison, when the filter circuit is in the calibration mode.

2. The filter circuit according to claim 1, wherein the oscillation circuit oscillates independently of a Q-value of the low-pass filter.

3. The filter circuit according to claim 1, wherein a Q-value of the low-pass filter is determined by a ratio of values of filter components including resistors, capacitors and inductors.

4. The filter circuit according to claim 1, wherein:
   the low-pass filter is a fourth-order Butterworth low-pass filter; and
   an oscillation frequency of the oscillation circuit is equal to a cut-off frequency of the low-pass filter.

5. The filter circuit according to claim 1, wherein:
   the low-pass filter is a low-pass filter included in a complex band-pass filter; and a frequency characteristic of the complex band-pass filter and the frequency characteristic of the low-pass filter are determined by a ratio of values of filter components including resistors, capacitors and inductors; and calibration of the frequency characteristic of the complex band-pass filter is realized by the calibration of the frequency characteristic of the low-pass filter.

6. A semiconductor device comprising a filter circuit, the filter circuit comprising:

a low-pass filter; and a calibration circuit calibrating a frequency characteristic of the low-pass filter, wherein the calibration circuit comprises:

a feedback circuit which forms an oscillation circuit with the low-pass filter when the filter circuit is in a calibration mode, the oscillation circuit being formed by a negative feedback loop having a gain larger than one; and a control circuit which controls the frequency characteristic of the low-pass filter so as to make an oscillation frequency of the oscillation circuit falls within a predetermined range, when the filter circuit is in the calibration mode, in which the feedback circuit comprises:

a comparator generating a digital output signal from an output signal of the low-pass filter;

a buffer generating a feedback signal from the digital output signal of the comparator; and a switch circuit which selects an input signal to output the input signal as an input signal of the low-pass filter when the filter circuit is in a normal mode, and selects the feedback signal to output the feedback signal as the input signal of the low-pass filter when the filter circuit is in the calibration mode, and the control circuit comprises:

a counter which performs a count operation during a predetermined period which is set based on a period of the digital output signal of the comparator, when the filter circuit is in the calibration mode; and an adjustment circuit which compares a count value of the counter and a reference value to adjust the frequency characteristic of the low-pass filter according to a result of the comparison, when the filter circuit is in the calibration mode.

\* \* \* \* \*